United States Patent
Mayer et al.

(10) Patent No.: US 10,161,817 B2
(45) Date of Patent: Dec. 25, 2018

(54) REDUCED STRESS PRESSURE SENSOR

(71) Applicant: InvenSense, Inc., San Jose, CA (US)

(72) Inventors: Felix Mayer, Baar (CH); Marc Von Waldkirch, Zurich (CH); Johannes Buhler, Uster (CH); Rene Hummel, Baar (CH); Stephan Braun, Stafa (CH); Marion Hermersdorf, Rodermark (DE); Chung-Hsien Lin, Hsinchu (TW)

(73) Assignee: InvenSense, Inc., San Jose, CA (US)

( * ) Notice: Subject to any disclaimer, the term of this patent is extended or adjusted under 35 U.S.C. 154(b) by 357 days.

(21) Appl. No.: 14/521,918

(22) Filed: Oct. 23, 2014

(65) Prior Publication Data
US 2015/0122038 A1 May 7, 2015

(30) Foreign Application Priority Data
Nov. 6, 2013 (EP) .................... 13005235

(51) Int. Cl.
*G01L 7/02* (2006.01)
*H01L 21/76* (2006.01)
(Continued)

(52) U.S. Cl.
CPC ............ *G01L 7/024* (2013.01); *B81B 7/0054* (2013.01); *G01L 7/022* (2013.01); *G01L 19/146* (2013.01);
(Continued)

(58) Field of Classification Search
CPC ....... G01L 7/024; G01L 7/022; G01L 19/146; B81B 7/005; B81B 2201/0264;
(Continued)

(56) References Cited

U.S. PATENT DOCUMENTS

| 4,625,561 A | 12/1986 | Mikkor |
| 4,730,496 A | 3/1988 | Knecht et al. |

(Continued)

FOREIGN PATENT DOCUMENTS

| CN | 1440504 A | 9/2003 |
| CN | 102169038 A | 8/2011 |

(Continued)

OTHER PUBLICATIONS

Office Action for European application No. 13005235.0 dated May 31, 2016.
(Continued)

*Primary Examiner* — Lisa Caputo
*Assistant Examiner* — Nathaniel T Woodward (57) ABSTRACT

A pressure sensor comprises a first substrate containing a processing circuit integrated thereon and a cap attached to the first substrate. The cap includes a container, a holder, and one or more suspension elements for suspending the container from the holder. The container includes a cavity and a deformable membrane separating the cavity and a port open to an outside of the pressure sensor. The container is suspended from the holder such that the deformable membrane faces the first substrate and such that a gap is provided between the deformable membrane and the first substrate which gap contributes to the port. Sensing means are provided for converting a response of the deformable membrane to pressure at the port into a signal capable of being processed by the processing circuit.

22 Claims, 7 Drawing Sheets

(51) Int. Cl.
*G01L 19/14* (2006.01)
*B81B 7/00* (2006.01)

(52) U.S. Cl.
CPC ...... *H01L 21/76* (2013.01); *B81B 2201/0264* (2013.01); *B81B 2207/012* (2013.01); *B81B 2207/096* (2013.01); *B81C 2203/0792* (2013.01); *Y10T 29/49002* (2015.01); *Y10T 29/49204* (2015.01)

(58) Field of Classification Search
CPC ........ B81B 2207/096; B81B 2207/012; H01L 21/76; Y10T 29/49002; Y10T 29/49204; B81C 2203/0792
USPC .......................................................... 73/715
See application file for complete search history.

(56) References Cited

U.S. PATENT DOCUMENTS

| | | | |
|---|---|---|---|
| 4,769,738 A | 9/1988 | Nakamura et al. | |
| 4,949,581 A | 8/1990 | Rud, Jr. | |
| 4,975,390 A | 12/1990 | Fujii et al. | |
| 5,062,302 A | 11/1991 | Petersen et al. | |
| 5,113,868 A | 5/1992 | Wise et al. | |
| 5,155,061 A | 10/1992 | O'Connor et al. | |
| 5,277,068 A | 1/1994 | Fukiura et al. | |
| 5,332,469 A | 7/1994 | Mastrangelo | |
| 5,334,569 A | 8/1994 | Kisalus | |
| 5,335,550 A | 8/1994 | Satou | |
| 5,343,064 A | 8/1994 | Spangler et al. | |
| 5,344,523 A | 9/1994 | Fung et al. | |
| 5,407,501 A | 4/1995 | Koen et al. | |
| 5,470,797 A | 11/1995 | Mastrangelo | |
| 5,525,280 A | 6/1996 | Shukla et al. | |
| 5,557,972 A | 9/1996 | Jacobs et al. | |
| 5,576,251 A | 11/1996 | Garabedian et al. | |
| 5,578,843 A | 11/1996 | Garabedian et al. | |
| 5,683,594 A | 11/1997 | Hocker et al. | |
| 5,929,498 A | 7/1999 | Ismail et al. | |
| 5,936,164 A | 8/1999 | Sparks et al. | |
| 6,038,928 A | 3/2000 | Maluf et al. | |
| 6,074,890 A | 6/2000 | Yao et al. | |
| 6,140,144 A | 10/2000 | Najafi et al. | |
| 6,143,583 A | 11/2000 | Hays | |
| 6,208,019 B1 | 3/2001 | Tane et al. | |
| 6,346,742 B1 | 2/2002 | Bryzek et al. | |
| 6,395,585 B2 | 5/2002 | Brandl | |
| 6,433,427 B1 | 8/2002 | Wu et al. | |
| 6,441,451 B1 | 8/2002 | Ikeda et al. | |
| 6,458,622 B1 | 10/2002 | Keser et al. | |
| 6,465,271 B1 | 10/2002 | Ko et al. | |
| 6,499,354 B1 | 12/2002 | Najafi et al. | |
| 6,520,014 B1 | 2/2003 | Brandl | |
| 6,533,554 B1 | 3/2003 | Vargo et al. | |
| 6,552,404 B1 | 4/2003 | Hynes et al. | |
| 6,556,418 B2 | 4/2003 | Aigner et al. | |
| 6,584,854 B2 | 7/2003 | Kimura et al. | |
| 6,700,174 B1 | 3/2004 | Min et al. | |
| 6,713,828 B1 | 3/2004 | Chavan et al. | |
| 6,743,656 B2 | 6/2004 | Orcutt et al. | |
| 6,777,263 B1 | 8/2004 | Gan et al. | |
| 6,962,867 B2 | 11/2005 | Jackson et al. | |
| 6,973,835 B2 | 12/2005 | Rangsten et al. | |
| 7,015,060 B1 | 3/2006 | Kubena et al. | |
| 7,122,458 B2 | 10/2006 | Cheng et al. | |
| 7,246,525 B2 | 7/2007 | Birkelund et al. | |
| 7,273,763 B1 | 9/2007 | Neumeier et al. | |
| 7,468,552 B2 | 12/2008 | Ohta | |
| 7,482,193 B2 | 1/2009 | DCamp et al. | |
| 7,539,003 B2 | 5/2009 | Ray et al. | |
| 7,704,774 B2 | 4/2010 | Mayer et al. | |
| 8,008,738 B2 | 8/2011 | Villa et al. | |
| 8,049,287 B2 | 11/2011 | Combi et al. | |
| 8,304,919 B2 | 11/2012 | Pendse et al. | |
| 8,536,663 B1 * | 9/2013 | Kuo | B81B 7/0061 257/252 |
| 8,567,256 B2 | 10/2013 | Albicker et al. | |
| 8,704,318 B2 | 4/2014 | Zhou | |
| 9,330,929 B1 | 5/2016 | Kautzsch et al. | |
| 2001/0023087 A1 | 9/2001 | Brandl | |
| 2002/0048839 A1 | 4/2002 | Miller et al. | |
| 2002/0185737 A1 | 12/2002 | Regan et al. | |
| 2003/0056598 A1 | 3/2003 | Kimura et al. | |
| 2003/0093895 A1 | 5/2003 | Miyazaki et al. | |
| 2003/0143775 A1 | 7/2003 | Brady | |
| 2003/0154796 A1 | 8/2003 | Ishio et al. | |
| 2004/0171195 A1 | 9/2004 | Raben | |
| 2005/0016289 A1 | 1/2005 | Saito et al. | |
| 2005/0124159 A1 | 6/2005 | Kalvesten et al. | |
| 2005/0156320 A1 | 7/2005 | Mastromatteo | |
| 2005/0229711 A1 | 10/2005 | Ohms et al. | |
| 2006/0014358 A1 | 1/2006 | Sawyer et al. | |
| 2006/0027522 A1 | 2/2006 | Martin et al. | |
| 2006/0032039 A1 | 2/2006 | Rangsten et al. | |
| 2006/0063354 A1 | 3/2006 | Fortin et al. | |
| 2006/0097331 A1 | 5/2006 | Hattori et al. | |
| 2006/0169049 A1 | 8/2006 | Matsubara | |
| 2006/0243054 A1 | 11/2006 | Saito et al. | |
| 2007/0019101 A1 | 1/2007 | Minamio et al. | |
| 2007/0141808 A1 | 6/2007 | Fortin et al. | |
| 2007/0275495 A1 | 11/2007 | Mayer et al. | |
| 2008/0016683 A1 | 1/2008 | Brida et al. | |
| 2008/0036082 A1 | 2/2008 | Eun | |
| 2008/0061412 A1 | 3/2008 | Shen et al. | |
| 2008/0236292 A1 * | 10/2008 | Reijs | B81B 3/0072 73/727 |
| 2008/0251705 A1 | 10/2008 | Tseng | |
| 2009/0166827 A1 | 7/2009 | Foster et al. | |
| 2009/0322929 A1 | 12/2009 | Webster | |
| 2010/0055821 A1 | 3/2010 | Buhler et al. | |
| 2010/0109140 A1 | 5/2010 | Oh et al. | |
| 2010/0139409 A1 | 6/2010 | Mitschke et al. | |
| 2010/0171153 A1 | 7/2010 | Yang | |
| 2010/0207217 A1 | 8/2010 | Zuniga-Oritiz et al. | |
| 2010/0242605 A1 | 9/2010 | Offterdinger | |
| 2011/0027930 A1 | 2/2011 | El-Gamal et al. | |
| 2011/0230068 A1 | 9/2011 | Pahl | |
| 2012/0037935 A1 | 2/2012 | Yang | |
| 2012/0037953 A1 | 2/2012 | Hayano | |
| 2013/0093030 A1 | 4/2013 | Isebrand et al. | |
| 2013/0127000 A1 | 5/2013 | Oganesian | |
| 2013/0181314 A1 | 7/2013 | Ryu et al. | |
| 2013/0264755 A1 | 10/2013 | Eskridge | |
| 2013/0276544 A1 * | 10/2013 | Potasek | B81B 7/0048 73/715 |
| 2015/0040675 A1 | 2/2015 | Ding | |
| 2015/0048461 A1 | 2/2015 | Mayer | |
| 2015/0122038 A1 | 5/2015 | Mayer et al. | |
| 2015/0122041 A1 | 5/2015 | Lin et al. | |
| 2015/0122042 A1 | 5/2015 | Lin et al. | |
| 2015/0260593 A1 | 9/2015 | Hsu et al. | |
| 2015/0268115 A1 | 9/2015 | Robert et al. | |
| 2015/0270180 A1 | 9/2015 | Yang | |
| 2016/0025583 A1 | 1/2016 | Besling et al. | |

FOREIGN PATENT DOCUMENTS

| | | | |
|---|---|---|---|
| DE | 10027234 A1 | 12/2000 | |
| DE | 19929025 A1 | 12/2000 | |
| DE | 10201054 A1 | 1/2003 | |
| DE | 10-2005-008959 A1 | 9/2006 | |
| DE | 102009046692 | 5/2011 | |
| DE | 102010001073 | 7/2011 | |
| EP | 0155517 A2 | 9/1985 | |
| EP | 0596711 A2 | 5/1994 | |
| EP | 0633459 A2 | 1/1995 | |
| EP | 0992778 A2 | 4/2000 | |
| EP | 0993778 A1 | 4/2000 | |
| EP | 1555517 A2 | 7/2005 | |
| EP | 1860417 | 11/2007 | |
| EP | 1860417 A2 * | 11/2007 | ........... B81C 1/0023 |
| EP | 2075221 | 7/2009 | |
| EP | 2135839 A2 | 12/2009 | |

(56) References Cited

FOREIGN PATENT DOCUMENTS

| EP | 2246292 | | 11/2010 |
| --- | --- | --- | --- |
| EP | 2421037 | | 2/2012 |
| EP | 2647594 | A2 | 10/2013 |
| EP | 02653443 | | 10/2013 |
| EP | 2790214 | | 10/2014 |
| EP | 2871455 | A1 | 5/2015 |
| JP | 2007-057238 | A | 3/2007 |
| JP | 200757238 | | 3/2007 |
| WO | 00/36387 | A1 | 6/2000 |
| WO | 03/36387 | A1 | 6/2000 |
| WO | 03/06387 | A2 | 1/2003 |
| WO | 03/034016 | A1 | 4/2003 |
| WO | 2004-106879 | A1 | 12/2004 |
| WO | 2007-117198 | A1 | 10/2007 |

OTHER PUBLICATIONS

Wikipedia, "Silicon on Insulator", Oct. 17, 2013, pp. 1-5.

Bates et al., "CMOS-based Microsensors and Packaging," Sensors and Actuators, vol. 92, No. 1-3, pp. 1-9, Aug. 1, 2001. 9 pages.

EP Extended Search Report dated Apr. 25, 2014 in EP Application No. 13005235.0. 9 pages.

EP Extended Search Report dated Apr. 3, 2013 in EP Application No. 12007333.3. 6 pages.

EP Extended Search Report dated Dec. 9, 2010 in EP Application No. 10009453.1. 7 pages.

EP Extended Search Report dated Nov. 20, 2015 in EP Application No. 15173033.0. 10 pages.

EP Extended Search Report dated Oct. 11, 2006 in EP Application No. 06010606.9. 10 pages.

EP Extended Search Report dated Oct. 2, 2015 in EP Application No. 15000967.8. 6 pages.

EP Extended Search Report dated Oct. 20, 2009 in EP Application No. 07008470.2. 18 pages.

Allan, Roger, "MEMS Inertial Sensors Push Size, Performance Limits for Next-Gen Mobile Devices," Apr. 13, 2010, ElectronicDesign, found at http://electronicdesign.com/components/mems-inertial-sensors-push-size-performance-limits-next-gen-mobile-devices. 12 pages.

Allan, Roger, "Ever-Shrinking ICs Turn to Exotic Packaging Methods," Jan. 14, 2009, ElectronicDesign, found at http://electronicdesign.com/interconnects/ever-shrinking-ics-turn-to-exotic-packaging-methods. 7 pages.

Figure 8, cited in above-listed article (Roger Allan, 2010), found at http://electronicdesign.com/site-files/electronicdesign.com/files/archive/electronicdesign.com/content/14978/60071_fig_08.jpg. 9 pages.

Figure 2, cited in above-listed article (Roger Allan, 2009), found at http://electronicdesign.com/site-files/electronicdesign.com/files/archive/electonicdesign.com/files/29/20374/fig_02.gif. 1 page.

Kiihamaki et al., "Integrated Pressure Sensors on SOI," Micro Structure Workshop, 2004. 4 pages.

Klaassen et al., "Silicon Fusion Bonding and Deep Reactive Ion Etching; A New Technology From Microstructures," The 8th International Conference on Solid-State Sensors and Actuators, and Eurosensors IX, Stockholm, Sweden, Jun. 25-29, 1995. 4 pages.

Peterson et al., "Silicon Fusion Bonding for Pressure Sensors," NocaSensor, TH215-4/88/0000-01444, 1988, pp. 144-147. 4 pages.

EP Extended Search Report dated Apr. 28, 2014 in EP Application No. 13005236.0. 11 pages.

\* cited by examiner

REDUCED STRESS PRESSURE SENSOR

CROSS REFERENCES TO RELATED APPLICATIONS

This application claims the priority of European patent application 13005235.0, filed Nov. 6, 2013, the disclosure of which is incorporated herein by reference in its entirety.

FIELD OF THE INVENTION

The present invention relates to a pressure sensor and a method for manufacturing a pressure sensor.

BACKGROUND OF THE INVENTION

Pressure sensors and methods of manufacturing pressure sensors are known. In the U.S. Pat. No. 7,704,774 B2 for example, there is described a pressure sensor, which is manufactured by joining two substrates, the first substrate comprising CMOS circuitry and the second being an SOI substrate. A cavity is formed in a top material layer of the first substrate, which is covered by the silicon layer of the second substrate. Part or all of the substrate of the second wafer is removed to form a membrane from the silicon layer. Alternatively it is further described that the cavity can be formed in the second substrate. The second substrate is electrically connected to the circuitry on the first substrate. The known design allows for the use of standard CMOS processes for integrating circuitry on the first substrate.

In pressure sensors the membrane may be sensitive to stress. When a pressure sensor is mounted with its back side to a carrier and is electrically connected thereto mechanical stress may be evoked and transmitted via solder balls to the first substrate and specifically to stress sensitive structures of the pressure sensor such as the membrane.

SUMMARY OF THE INVENTION

Hence, according to a first aspect of the invention, there is provided a pressure sensor, particularly an absolute pressure sensor, with a deformable membrane providing a separation between a cavity with in the case of an absolute pressure sensor an essentially constant pressure and a port open to the outside of the sensor. The cavity is formed in a container contributing to a cap which cap is attached to a first substrate with a processing circuit integrated thereon. The cap further contains a holder for the container. The container is suspended from the holder by means of one or more suspension elements. The container further contains the deformable membrane a deformation of which is converted by suitable sensing means into a signal that is supplied to and processed by the processing circuit in the first substrate.

In this arrangement, the deformable membrane in essence is mechanically decoupled from the first substrate via which first substrate stress may be induced from an external carrier of the pressure sensor, or during mounting of the pressure sensor to an external carrier. Not only is the deformable membrane no longer attached to the first substrate containing the processing circuit but is integrated into the cap. Moreover, the membrane is also mechanically decoupled within the cap from the cap portion that is mounted to the first substrate, i.e. the holder. Hence, any propagation of stress induced via the first substrate towards the membrane is significantly reduced.

The container of the cap is arranged such that the deformable membrane faces the first substrate, and preferably faces a front side of the first substrate on which the processing circuit is integrated. A gap is provided between the deformable membrane and the front side of the first substrate in order to allow a deflection of the membrane in a direction orthogonal to the plane of the cap. In such arrangement, the deformable membrane is protected given that it does not directly face the environment of the sensor.

In a preferred embodiment, the cap is at least partly manufactured from a second substrate. While the first substrate preferably is a semiconductor substrate such as a silicon substrate, the second substrate may be a semiconductor substrate, too, such as a silicon substrate. Hence, the second substrate may, for example, contain a bulk material made from silicon and various layers stacked on the bulk material such as one or more of metal layers, insulation layers and passivation layers. It is preferred that the cavity is formed solely in the layer stack of the second substrate and does not reach into the bulk material.

In a preferred embodiment, the deformable membrane is built from a third substrate, which is attached to the top layer of the second substrate. The third substrate may, for example, be an SOI (Silicon On Insulator) substrate, wherein specifically the deformable membrane may be built from a silicon layer of the SOI substrate while an insulation layer and bulk material of the SOI substrate are removed during processing.

The container of the cap preferably is built by applying one or more grooves through the second substrate. By way of manufacturing the one or more grooves, one or more small portions of the second substrate remain for mechanically linking the container to the holder. Such small portion acts as suspension elements for suspending the container from the holder. Preferably, the one or more grooves are arranged vertically in the second substrate, i.e. orthogonal to a plane extension of the second substrate, i.e. orthogonal to a plane extension of the cap. In case the deformable membrane is made from a third substrate the one or more grooves may penetrate the third substrate, too, in order to decouple the container from the holder.

Hence, the container provides a housing for the cavity which cavity is closed by the deformable membrane. The one or more grooves preferably encircle the container in the plane of the cap and—in case there is a plurality of grooves—alternate with the suspension elements which suspension elements preferably constitute the sole mechanical link between the container and the holder. Each suspension element may contain a ridge, e.g. four ridges may be provided that hold the container. Preferably, the one or more suspension elements are formed integrally with the container and the holder given that in a preferred embodiment at least parts of the container, the holder and the one or more suspension elements are built from the second substrate. In a preferred embodiment, the one or more suspension elements do not represent the shortest path between the container and the holder but do have a shape that allows one or more of a deflection or a rotation of the container relative to the holder, e.g. a deflection in at least one direction of the plane of the cap. In such way, translational and/or rotational forces applied to the container may be dampened without damaging the one or more suspension elements. The one or more suspension elements may contain spring portions for this purpose.

The one or more suspension elements preferably act as components of reduced stiffness for reducing stress that otherwise migrates to the container. The one or more grooves to a large extent decouple the container from the holder and preferably surround the container except for the one or more suspension elements, e.g. in form of small areas or bridges. Summarizing, the stress sensitive deformable membrane is mechanically decoupled from the first substrate which is the component accepting stress when being mounted to a support.

It is preferred, that the cap has two different heights orthogonal to its plane extension, wherein the height of the container is less than the height of the holder. While the origin of this embodiment may lie in the manufacturing process as will be explained later on, a recess in the backside of the cap may provide access to the grooves. In order to prevent particles from entering an interior of the pressure sensor and either disturb the suspension of the container or even migrate towards the membrane and hinder its deflection it is preferred to apply a protection membrane over the recess. Preferably, the protection membrane is porous and at least allows a diffusion of the medium which pressure is desired to be sensed. Preferably, the membrane is made from PTFE. In such embodiment, the port for applying a medium to the membrane may contain the recess, the grooves and at least a part of the gap between the deformable membrane and the first substrate.

The sensing means may in one embodiment contain the deformable membrane itself serving as first electrode and as such containing electrically conducting material. On the other hand, a second electrode may be arranged near or in the cavity at a stationary position such that this electrode arrangement may allow sensing a capacitance between the second electrode and the deflectable membrane which capacitance is dependent on the distance between the electrodes. For example, in case a medium such as a gas is applied to the cavity at a defined pressure and a deflection of the membrane is evoked, a distance between the electrodes may change and result in a change of the capacitance. In one embodiment, the second electrode may be made from one of the electrically conducting layers contributing to the second substrate, which may be a metal layer, or in another embodiment, may be a polysilicon layer.

In a preferred embodiment, the electrodes are electrically connected to the processing circuit arranged in the first substrate. For this purpose, the suspension elements at least provide for electrically conducting portions. In case the container and the holder are both manufactured from the same second substrate, one or more of the electrically conducting layers may be used for transferring the signal from the electrodes of the container to the holder. Different suspension elements may be used for connecting the different electrodes, or the same suspension element may be used in case of two electrically conducting layers being isolated from each other.

For electrically connecting the holder to the first substrate, electrical connections may be provided between the second substrate and the first substrate, e.g. in form of solder bumps or balls, or other electrically conducting elements that at the same time may also serve as spacer elements for providing the gap between the first substrate and the deformable membrane. In order to connect to the electrically conducting layers in the holder, contact windows may be provided into the second substrate and if applicable through the portion of the third substrate contributing to the holder. On the other hand, the spacer elements may connect to contact pads on the first substrate which may be areas of conducting layers revealed from the first substrate.

According to another aspect of the present invention, a method is provided for manufacturing a pressure sensor. A first substrate is provided with a processing circuit integrated thereon, as well as a second substrate and a third substrate. In the second substrate, a cavity is manufactured as well as one or more trenches around a first portion of the second substrate containing the cavity. The manufacturing of the cavity and the one or more trenches may preferably be performed in the same manufacturing step, e.g. by etching. In another embodiment, the second substrate is prefabricated with the cavity and the one or more trenches. In the following, the third substrate is mounted to the second substrate thereby covering the cavity in the second substrate to form a deformable membrane for sensing a pressure applied thereto. In the following, the assembly of the second substrate and the third substrate is mounted to the first substrate with the deformable membrane facing the first substrate. There are spacer elements provided for mounting the deformable membrane distant from a surface of the first substrate in order to provide a gap between the deformable membrane and the first substrate. In case the one or more trenches do not yet reach through the second substrate, it is preferred that in a next step, a recess is manufactured in a backside of the second substrate opposite the side the deformable membrane is attached to, which recess is manufactured in a sufficient depth for laying open the one or more trenches thereby forming one or more grooves through the second substrate. In an alternate embodiment, this step may also be conducted prior to mounting the assembly of the first and the second substrate to the first substrate, such that preferably the etching of the recess is applied to the stand alone assembly.

In case the second substrate contains a bulk material such as silicon and layers stacked onto the bulk material, it is preferred that the cavity only extends into one or more of the layers but not into the bulk material. However, the one or more trenches may be etched or otherwise manufactured such that they reach at least into part of the bulk material and completely intersect the stacked layers. The one or more trenches and the cavity are preferably manufactured from the same side of the second substrate, i.e. its top side.

In a preferred step, the third substrate includes an SOI (Silicon On Insulator) substrate. The third substrate preferably is attached to a top layer of the second substrate. Then, bulk material of the SOI substrate and its insulating layer preferably are removed thereby leaving a silicon layer as deformable membrane spanning the cavity in the second substrate.

Preferably, in a step following the previous step of applying the third substrate to the second substrate, a portion of the third substrate that is separated from the deformable membrane by means of the one or more trenches is treated in that one or more contact windows are etched there through and preferably are etched into at least some of the layers of the second substrate in order to provide access to electrically conducting layers therein. These electrically conducting layers in turn may be connected to the electrodes in the container via one or more of the suspension elements. The contact windows are metalized. The third substrate may also be opened at the locations of the one or more trenches in the second substrate, e.g. by etching. It is preferred that the last step may be conducted together with the etching of the contact windows.

In an alternate embodiment, at the beginning of processing the second substrate the cavity may be formed therein without forming the one or more trenches at the same time. The cavity may be closed by the third substrate and only thereafter the one or more trenches may be manufactured through the third substrate into the second substrate. This step may be applied together with the manufacturing of the contact windows.

The one or more trenches may not be manufactured at a sufficient depth for generating one or more grooves that reach through the entire bulk material of the second substrate. Hence, there may be another processing step to open the one or more trenches from the backside of the second substrate, i.e. opposite to the side the deformable membrane is attached to. Preferably, a recess is manufactured into an area of the second substrate that at least covers the one or more trenches and is dimensioned such that the one or more trenches are laid open and are accessible via the recess. It is preferred that the manufacturing of this recess is also implemented by etching. In a preferred embodiment, the bulk material of the second substrate is first thinned all across the second substrate in order to facilitate the etching of the recess. In a preferred embodiment, the entire backside of the container with the membrane is etched for generating a recess such that the resulting cap has a container height that is less than a holder height. For etching the recess, it may be preferred that a hard mask is applied to the backside of the second substrate after thinning and prior to etching. After having manufactured the recess, it is preferred that a protection membrane is applied to the hard mask for covering the recess.

In the first substrate electrically conducting vias may be built for electrically connecting the processing circuit to electrical contacts at its backside opposite the side facing the deformable membrane. It may be preferred that the vias are built in the first substrate after having mounted the assembly of the second substrate and the third substrate to the first substrate and prior to manufacturing the recess in the backside of the second substrate. In a preferred variant of the invention, the one or more vias are made using a TSV (Through Silicon Via) process. Prior to e.g. etching the holes for the vias into the first substrate, a thickness of the first substrate may be reduced, e.g. down to 150 µm (micron) or less rendering it more suitable for TSV or similar processes. When reducing the thickness of the first substrate the second substrate may protect the membrane and other sensitive structures, into which second substrate the recess for opening the trenches preferably is not manufactured yet.

A total height of the pressure sensor stack may preferably be between 350 to 500 microns.

It is preferred that the processing circuit is fabricated in the first substrate by a CMOS process following well-known steps.

In a very preferred embodiment, the method is executed on a wafer scale, i.e. multiple pressure sensors are manufactured in the same manufacturing step on the same wafer. At the very end, the individual pressure sensors are separated from each other by dicing the wafers. Prior to the separation step, a first wafer is provided with multiple processing circuits being preprocessed thereon, as well as a second and a third wafer corresponding to the second and third substrate. The cavities and the trenches are manufactured in the second wafer, and the second wafer prepared in this manner is attached to the third wafer for processing the deformable membranes. The assembly of the second and the third wafer may then be mounted to the first wafer with the deformable membranes facing the first wafer. Still on wafer scale, the recesses may be manufactured into the backside of the second wafer, and, if any, a protection membrane layer may be applied to the entire backside of the second wafer for covering the recesses. If applicable, the first wafer may then be processed from its backside, e.g. by manufacturing vias. At the very end, the wafer stack may be separated into individual pressure sensor chips.

The described embodiments similarly pertain to the sensor and the method. Synergetic effects may arise from different combinations of the embodiments although they might not be described in detail.

While it is preferred that the order of method steps is as listed in the claims, a different order shall be encompassed by the subject method claims, too, where technically applicable.

Other advantageous embodiments are listed in the dependent claims as well as in the description below.

BRIEF DESCRIPTION OF THE DRAWINGS

Embodiments of the present invention, aspects and advantages will become apparent from the following detailed description thereof. Such description makes reference to the annexed drawings, wherein the figures show:

FIG. 2 a) schematic top and b) sectional views of a pressure sensor in accordance with an example of the invention.

DETAILED DESCRIPTION

The term "pressure sensor" as used herein designates any type of sensor measuring a parameter that is equal to or derived from the pressure of a fluid. In particular, the term designates relative (i.e. differential) as well as absolute pressure sensors, it also covers static as well as dynamic pressure sensors. Typical examples of applications of such sensors are e.g. in scientific instrumentation, meteorology, altitude measurement, sound recording, mobile or portable computers and phones etc.

Figure 1:
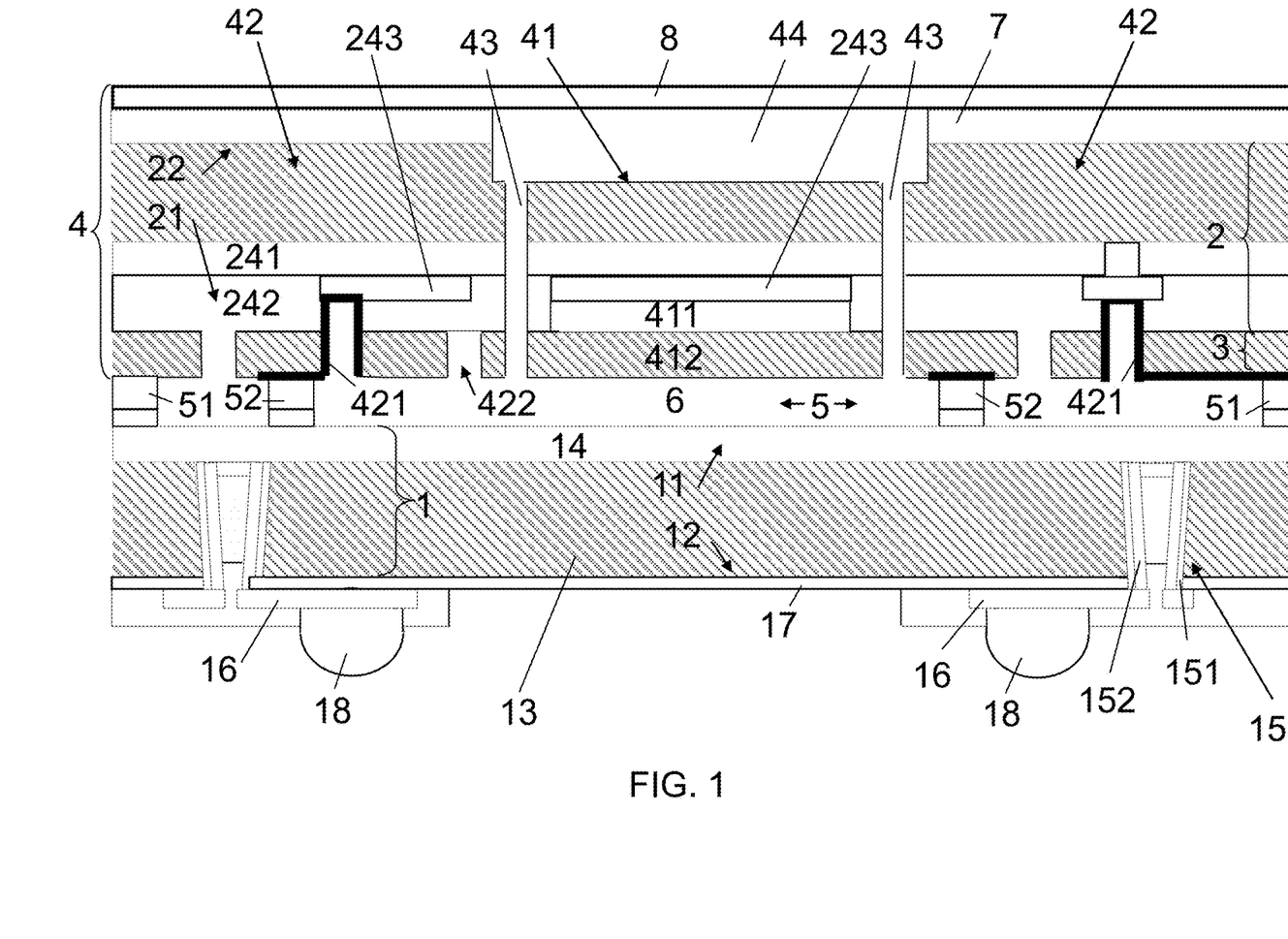
FIG. 1 a schematic sectional view of a pressure sensor in accordance with an example of the invention.

FIG. 1 shows a schematic sectional view of a pressure sensor in accordance with an embodiment of the present invention.

The pressure sensor includes a first substrate 1 and a cap 4 for the first substrate 1. The first substrate 1 is a semiconductor substrate, e.g. a silicon substrate, with a front side 11 and a back side 12. The semiconductor substrate 1 includes bulk material 13 such as silicon, and a stack of layers collectively referred to as 14 on the bulk material 13. These layers 14 may be arranged for CMOS processing of the substrate 1, and as such may also be denoted as CMOS layers or material layers. Specifically, the layers 14 can include for example a plurality of SiO2 layers, metal or polysilicon layers. The bulk material 13 may contain doped regions (not shown) within the silicon. These components can form active circuitry, such as amplifiers, A/D converters or other analog and/or digital signal processing units. The top layer of the stack of layers 14 may be a dielectric layer of silicon oxide and/or silicon nitride protecting the structures below it. In the present example, it is assumed that a processing circuit (not further shown) is integrated on the front side 11 of the substrate 1 by means of CMOS processing.

The substrate 1 contains vias 15 reaching vertically through the substrate 1. Those vias 15 provide for an electrical connection from the front side 11 of the substrate 1 to its backside 12. Those vias 15 are manufactured by etching or drilling holes into the substrate 1 from its backside 12, by applying an oxide 151 to the hole, and by applying conducting material 152 to the oxide 151. At the back side 12 of the substrate 1, the vias 15 are electrically connected to contact pads 16 residing on an oxide layer 17 applied to the bulk material 13, which contact pads 16 serve as support for solder balls 18 for electrically connecting the pressure sensor to the outside world. Alternative to the vias 15 and the solder balls 18, there may be other ways of interconnecting the pressure sensor to the outside world, e.g. by means of wire bonds, bond pads or a conducting structures that lead from the front side 11 of the first substrate 1 along its sides to the backside 12. The electrical connection to the outside world may also be implemented via one or more of a Land Grid Array, a Pin Grid Array, or a leadframe.

The cap 4 contains a container 41 and a holder 42 for the container 41. Suspension elements not shown in the present illustration are provided for suspending the container 41 from the holder 42. The holder 42 preferably encircles the container 41 in a plane of the cap 4.

Parts of the container 41 and the holder 42 are made from a second substrate 2. The second substrate 2 is a semiconductor substrate, preferably a silicon substrate, and has a front side 21 and a backside 22. The second substrate 2 again contains a bulk material 23 of silicon and a stack of layers 24 on the bulk material 23. Specifically, the stack of layers 24 may include oxide layers 241 and 242, and a polysilicon layer 243.

The container 41 is separated from the holder 42 by grooves 43 that alternate with the suspension elements around the container 41. Owed to the manufacturing of the container 41 and the holder 42 from the common second substrate 2, both components include bulk material 23 from the second substrate 2 as well as the layer stack 24. In the container 41, a cavity 411 is formed by omitting or removing material from one or more of the layers 24. The cavity 411 is closed by a deformable membrane 412. The membrane 412 is sufficiently thin such that it deforms depending on a pressure drop between a pressure at the top of the membrane 412 and below it. The polysilicon layer 243 in the container 41 may be used as an electrode. The membrane 412 preferably is formed by a doped, conducting silicon layer, is arranged as a sealing lid over the cavity 411, and may be used as another electrode for which reason the deformable membrane 412 may contain electrically conducting material. Hence upon a change in pressure the membrane 412 deflects and as such a distance between the two electrodes changes which results in a change of the capacitance between the two electrodes. Corresponding signals may be transmitted from the electrodes to the holder 42 via the conducting one of the layers 24 that pass through the suspension elements.

In the present example, the deformable membrane 412 is built from a third substrate 3. The third substrate 3 as shown in FIG. 1 may be the remainder of an SOI substrate, specifically its device layer after some manufacturing steps. The remainder of the third substrate 3 outside the membrane 412, i.e. the portion that is attacked to the layer stack 24 of the holder 42 may contain contact windows 421 there through. At other locations, there may be isolation trenches 422 manufactured in the third substrate 3 for avoiding a short circuit of the membrane 412 with the contact windows 421.

The assembly containing the second and the third substrate 2,3 is attached to the front side 11 of the first substrate 1. The attachment may include bonding or other fusion techniques. In the present example, spacer elements 5 are provided between the third substrate 3 and the first substrate 1. The spacer elements 5 may have different functions: On the one hand, the spacer elements 5 provide for the gap 6 between the deformable membrane 412 and the first substrate 1 which is required for supplying the pressure medium to the membrane 412. On the other hand, some of the spacer elements 5 but not necessarily all may be electrically conductive for connecting the contact windows 421 to contact pads on the front side of the first substrate 1. Other or the same spacer elements 5 may provide mechanical stability for the stacking of substrates 1,3, and/or may provide mechanical protection to the inside of the pressure sensor, and specifically to the membrane 412. For this purpose, it may be preferred, that a spacer element 51 is arranged in from of a ring at the edges of the substrates 1,3 providing mechanical stability, protection as well as an electrical connection, while spacer elements 52 are rather pillar-like and provide electrical connections.

The signals provided by the two electrodes in the container 41 are supplied via suspension elements to the holder 42, via the contact windows 421 and one or more of the spacer elements 5 to the processing circuit of the first wafer 1. From the processing circuit, electrical signals may be supplied via the vias 15 to the solder balls 18.

At the backside 22 of the second substrate 2 the thickness of the bulk material 23 is partially reduced in the region of the container 41. The recess 44 to the backside 22 of the second substrate 2 is preferably etched with the aid of a previously applied hard mask 7. The hard mask 7 in turn is covered by a protection membrane 8 which protects the grooves 43 and the deformable membrane 412 from fluid or particles. The protection membrane 8 preferably is permeable to the pressure medium. A port for conducting the medium to the deformable membrane 412 in the present example encompasses the recess 44, the grooves 43, and the gap 6, or at least parts of.

The overall height of the pressure sensor in the present example is about 400 μm.

Figure 2:
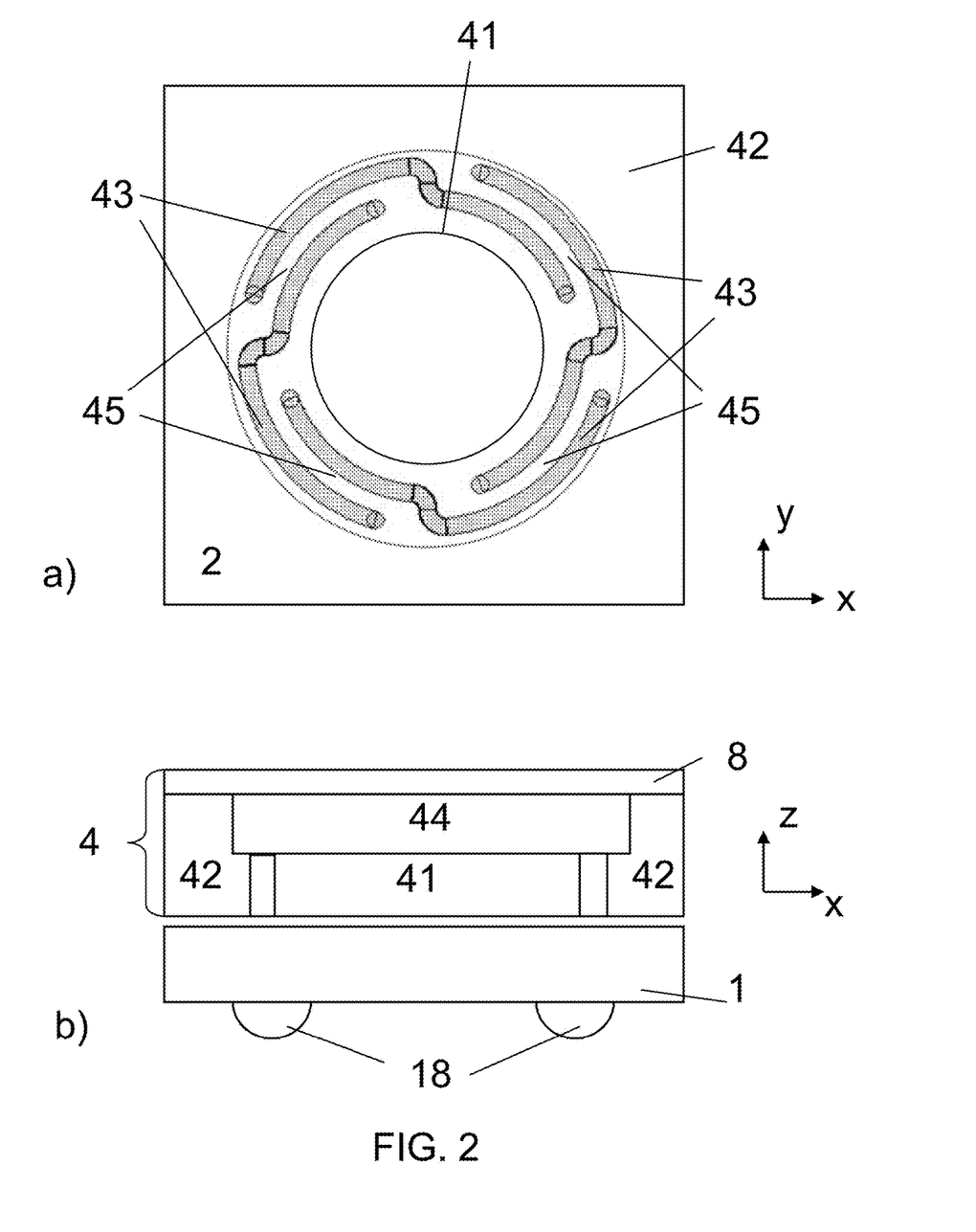

FIG. 2 illustrates another example of a pressure sensor in a top view in diagram a) and in a side cut in diagram b). The side cut in diagram 2b) is more schematic than the side cut of FIG. 1 and for illustration purposes solely shows the first substrate 1 with solder balls 18 attached, the cap 4 attached to the first substrate 1, the cap 4 containing the container 41 and the holder 42, the recess 44 in the cap 4, and the protection membrane 8 covering the recess 43 in the cap 4.

Diagram 2a) illustrates the corresponding top view without the protection membrane 8, and as such illustrates the suspension of the container 41 from the holder 42. Basically, all that can be seen from the top is the second substrate 2 structured for building the container 41 and the holder 42. For this purpose, grooves 43 are arranged vertically through the second substrate 2. The grooves 43 have a shape as shown in FIG. 2a) and as such build suspension elements 45 between the grooves 43 that hold the container 41. The suspension elements 45 are mechanical links between the container 41 and the holder 42, and may allow for a slight displacement of the container 41 in the plane of the cap 4, and especially in the x and y direction.

Figure 3:
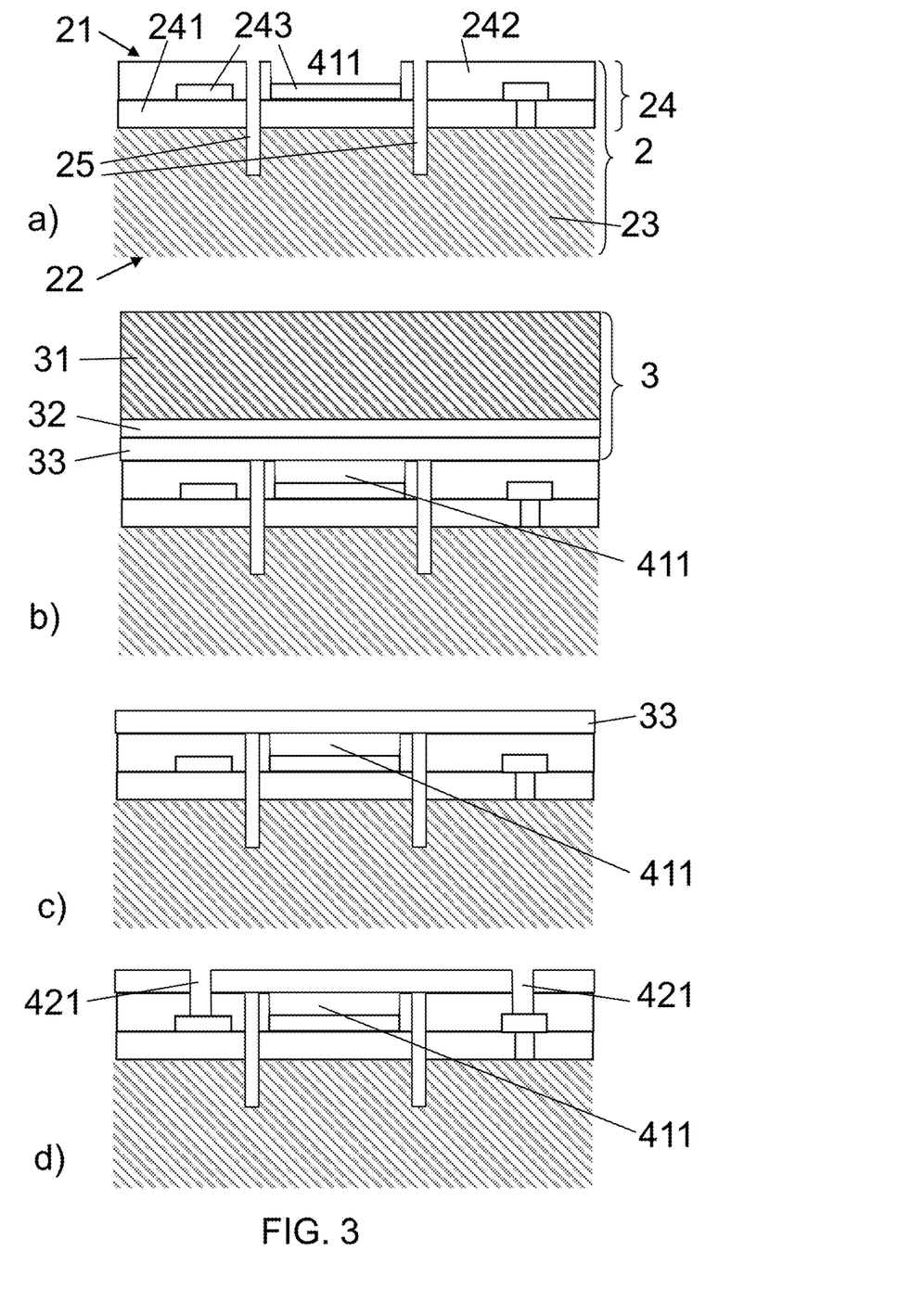
FIG. 3 in its diagrams a) to l) schematic cross-sections of a pressure sensor according an embodiment of the present invention during processing thereby illustrating processing steps of a method according an embodiment of the present invention.

FIG. 3 shows in its diagrams a) to l) schematic cross-sections of a pressure sensor according an embodiment of the present invention during manufacturing thereby illustrating the individual processing steps.

In FIG. 3a) a second substrate 2 is provided with a front side 21 and a back side 22 including a bulk material 23 and layers 24 stacked on the bulk material 23, which layers 24 are only schematically illustrated and may contain oxide layers 241, 242, e.g. SiO2, and a polysilicon layer 243. A cavity 411 is etched into the layers 24, and trenches 25 are etched through the layers 24 into the bulk material 23, e.g. by deep reactive ion etching. The trenches 25 and the cavity 411 may be etched in the same etching step.

In a next step illustrated in FIG. 3b) a third substrate 3 in form of an SOI substrate is attached to the layers 24 of the second substrate 2 at its front side 21 e.g. by fusion bonding. The SOI substrate contains bulk material 31, an insulation layer 32 in form of a BOX layer, and a silicon layer 33 as device layer. As a result, the cavity 411 and the trenches 25 are closed.

In a further step illustrated in FIG. 3c), the bulk material 31 and the insulation layer 32 of the SOI substrate are removed such that the silicon layer 33 remains covering the cavity 411, which silicon layer 33 is thin enough to deflect in response to pressure applied.

In the step illustrated in FIG. 3d), contact windows 421 are etched through the third substrate 3 into the layers 24 of the second substrate 2. In FIG. 3e), the contact windows 421 are metalized and electrically conducting spacer elements 5 are applied to the third substrate 3.

In the step illustrated in FIG. 3f), the silicon layer 33 representing the third substrate 3 is etched for opening the trenches 25 in the second substrate 2, and for generating trenches 422 for electrical isolation. Now, the container 41 and the holder 42 for the container 41 are prepared. The entire assembly including the second and third substrate 2,3 now is flipped and attached to a first substrate 1, see FIG. 3g). The first substrate 1 itself is prefabricated in that a processing circuit (not shown) is integrated in layers 14 stacked on a bulk material 13 at a front side 11 of the first substrate 1.

In a next step as illustrated in FIG. 3h), the second substrate 2 may be thinned from its back side 22 to a reduced thickness in the range of e.g. 100 to 200 microns. This process can be performed using grinding, etching or milling. Afterwards, a hard mask 7 is applied to the backside 22 of the second substrate 2.

In the step illustrated in FIG. 3i), the first substrate 1 is processed: Vias 15 are manufactured through the first substrate 1, and solder balls 18 are attached to the backside 12 of the first substrate 1. In the step illustrated in FIG. 3j), the entire assembly is placed on a BGA (Ball Grid Array) protective foil 9. In the step illustrated in FIG. 3k), the backside 22 of the second substrate 2 is etched by using the hard mask 7. The recess 44 etched therein is deep enough to lay open the trenches 25 previously formed in the second substrate 2. In the step illustrated in FIG. 3l), a protective membrane 8 is applied to cover the recess 44.

Generally, instead of a protective membrane a hard layer may be applied containing an access opening contributing to the port. However, there may be alternative pressure sensors where neither a membrane nor any other protection means is required subject to the application and the design of the pressure sensor.

It should be noted, that the present invention is not limited to embodiments where the sensing element is a capacitive sensor as described. Rather, it can be used with any type of pressure sensors that uses a deformable membrane in order to measure a quantity dependent on the pressure drop over the same. In particular, the invention can also be used for sensors where the deformation of the membrane is measured by piezoresistive means.

It should further be noted that in any removal of material during manufacturing, the corresponding structures may be created using a chemical (wet) etching process, plasma etching process, laser cutting, mechanical milling or a combination of any of these processes, where suitable.

While above there are shown and described embodiments of the invention, it is to be understood that the invention is not limited thereto but may be otherwise variously embodied and practised within the scope of the following claims.

The invention claimed is:

1. A pressure sensor, comprising:
   a first substrate containing layers for CMOS processing,
   a cap attached to a front side of the first substrate from its front side, wherein the cap includes a container, a holder, and two or more suspension elements to concentrically suspend the holder, wherein the two or more suspension elements are disposed on a back side of the cap for suspending the container from the holder, the container includes a cavity and a polysilicon layer, wherein the cavity is formed on a front side of the container and between the polysilicon layer of the container and a deformable membrane and wherein the cavity is closed by the deformable membrane, wherein the deformable membrane separates the cavity and a port that is positioned on the back side of the cap and is open to an outside of the pressure sensor, the container being suspended form the holder such that the deformable membrane faces the first substrate and such that a gap is provided between the deformable membrane and the first substrate which gap contributes to the port, and wherein the back side of the cap includes a recess formed on a back side of the container, and wherein a permeable protection membrane is disposed on the back side of the cap and covers the recess that is permeable to pressure medium, and
   sensing means for converting a response of the deformable membrane to pressure at the port into a signal capable of being processed by the processing circuit.

2. The sensor of claim 1, wherein the cap has a plane extension and wherein the holder encircles the container in the plane of the cap, wherein between the holder and the container are the two or more suspension elements and one or more grooves alternate.

3. The sensor of claim 2, wherein the first substrate is a semiconductor substrate, wherein the cap contains a second substrate and each groove is arranged orthogonal to the plane of the cap in the second substrate for separating the container from the holder.

4. The sensor of claim 3, wherein the second substrate contains a bulk material and layers stacked on the bulk material, wherein the cavity is a recess exclusively arranged in one or more of the layers of the second substrate, wherein the deformable membrane is made from a third substrate attached to the layers of the second substrate, and wherein the one or more grooves extend into the third substrate for separating the deformable membrane from a portion of the third substrate contributing to the holder.

5. The sensor of claim 4, wherein the sensing means contains a first electrode formed by the deformable membrane and a second electrode formed by one of the layers of the second substrate.

6. The sensor of claim 5, wherein the second electrode is made of polysilicon.

7. The sensor of claim 5, wherein the container is suspended from the holder with at least two suspension elements, and wherein the sensor further comprises at least two electrical connections between the cap and the first substrate, wherein the first electrode is electrically connected to the processing circuit via a suspension element of the at least two suspension elements and at least one of the electrical connections, wherein the second electrode is electrically connected to the processing circuit via another suspension element of the at least another two suspension elements and at least another one of the electrical connections.

8. The sensor of claim 7, wherein spacer elements are arranged between the first substrate and the third or the, second substrate for building the gap, and wherein the electrical connections are provided by at least some of the spacer elements.

9. The sensor of claim 1, wherein each suspension element contains a groove between the holder and the container, and wherein each suspension element has a shape allowing for a deviation of the container in at least one direction in the plane of the cap.

10. The sensor of claim 1, wherein a height of the container is less than a height of the holder orthogonal to the plane of the cap thereby forming a recess on a backside of the cap opposite to the side of the cap the deformable membrane is arranged.

11. The sensor of claim 10, wherein the recess is covered by a protection membrane.

12. A method for manufacturing a pressure sensor comprising:
providing a first substrate with a processing circuit integrated thereon;
providing a second substrate;
providing a third substrate;
manufacturing a cavity in the second substrate and one or more trenches around a first, portion of the second substrate containing the cavity;
mounting said third substrate to said second substrate to form a container, a holder, and two or more suspension elements to concentrically suspend the holder, wherein the two or more suspension elements are disposed on a back side of the second substrate for suspending the container from the holder, and wherein the holder includes the cavity and a polysilicon layer, wherein the cavity is closed on a front side of the container and between the polysilicon layer of the container and further closed by a deformable membrane, wherein the deformable membrane is configured for sensing a pressure applied to the deformable membrane, wherein the deformable membrane separates the cavity and a port that is positioned on the back side of the second substrate and is open to an, outside of the pressure sensor, and wherein a permeable protection membrane that is permeable to pressure is disposed on the back side of the second substrate and covers a recess formed on a back side of the container; and
mounting the assembly of the second substrate and the third substrate to the first substrate with the deformable membrane facing the first substrate and providing a gap between the deformable membrane and the first substrate wherein the deformable membrane faces the first substrate and wherein the gap contributes to the port.

13. The method of claim 12, wherein manufacturing the cavity in the second substrate includes manufacturing the cavity in one or more layers stacked on a bulk material of the second substrate, and wherein manufacturing the one or more trenches in the second substrate includes manufacturing the one or more trenches through the layers stacked on the bulk material and through at least a portion of the bulk material.

14. The method of claim 13, wherein the one or more trenches are manufactured through the entire bulk material.

15. The method of claim 13, wherein the one or more trenches are manufactured by etching.

16. The method of claim 12, wherein mounting said third substrate to said second substrate to form the deformable membrane includes attaching a silicon-on-insulator substrate to a top layer of the second substrate, removing a bulk material and an insulating layer of the silicon-on-insulator substrate and leaving a silicon layer as deformable membrane spanning the cavity in the second substrate.

17. The method of claim 16, wherein, mounting said third substrate to said second substrate includes in a portion of the third substrate outside the deformable membrane
etching through the third substrate for manufacturing one or more contact windows in the second substrate,
metalizing the one or more contact windows, and
laying open the one or more trenches in the second substrate by opening the third substrate at the location of the trenches.

18. The method of claim 12, wherein the recess is manufactured on the backside of the second substrate opposite a side the deformable membrane is attached to, wherein the recess is manufactured at a depth for laying open the one or more trenches previously manufactured into a portion of the bulk material and to form one or more grooves through the second substrate.

19. The method of claim 18, wherein after mounting the assembly of the second substrate and the third substrate to the first substrate and prior to manufacturing the recess in the backside of the second substrate, the second substrate is thinned and a hard mask is applied to the backside of the second substrate omitting an area for manufacturing the recess, and wherein after manufacturing the recess a protection membrane is applied to the hard mask for covering the recess, wherein the protection membrane is the permeable protection membrane.

20. The method of claim 19, wherein the gap between the first substrate and the assembly of the second and third substrate is manufactured by applying spacer elements between the first substrate and the assembly.

21. The method of claim 12, wherein electrically conducting vias are built through the first substrate for electrically connecting the processing circuit to electrical contact structures on a backside of the first substrate opposite the side facing the deformable membrane.

22. The method of claim 21, wherein the vias are built after having mounted the assembly of the second substrate and the third substrate to the first substrate and prior to manufacturing the recess in the backside of the second substrate.

* * * * *